United States Patent [19]

Strege

[11] Patent Number: 4,980,314

[45] Date of Patent: Dec. 25, 1990

[54] VAPOR PROCESSING OF A SUBSTRATE

[75] Inventor: Keith E. Strege, Somerville, N.J.

[73] Assignee: AT&T Bell Laboratories, Murray Hill, N.J.

[21] Appl. No.: 362,128

[22] Filed: Jun. 6, 1989

[51] Int. Cl.$^5$ .................... H01L 21/20; H01L 21/302
[52] U.S. Cl. .......................... 437/129; 148/DIG. 26; 148/DIG. 50; 148/DIG. 95; 156/644; 156/649; 372/48; 437/90; 437/133; 437/981
[58] Field of Search .................. 148/DIG. 22, 26, 50, 148/56, 51, 65, 72, 95, 97, 106, 110, 169, 33, 33.2, 33.4, 33.5; 156/610–614, 644, 647, 648, 649, 662, 654; 372/43, 45, 46, 48; 437/81, 89, 90, 108, 105, 107, 126, 129, 133, 225, 228, 947, 949, 962, 981

[56] References Cited

U.S. PATENT DOCUMENTS

| | | | |
|---|---|---|---|
| 4,317,085 | 2/1982 | Burnham et al. | 357/17 |
| 4,354,898 | 10/1982 | Coldren et al. | 156/662 |
| 4,525,841 | 6/1985 | Kitamura et al. | 372/48 |
| 4,547,956 | 10/1985 | Bouadma et al. | 437/129 |
| 4,595,454 | 6/1986 | Dautremont-Smith et al. | 156/647 |
| 4,652,333 | 3/1987 | Carney | 156/649 |
| 4,660,208 | 4/1987 | Johnston, Jr. et al. | 372/46 |
| 4,662,988 | 5/1987 | Renner | 156/648 |
| 4,675,074 | 6/1987 | Wada et al. | 156/649 |
| 4,676,863 | 6/1987 | Furuyama et al. | 156/649 |

FOREIGN PATENT DOCUMENTS

| | | | |
|---|---|---|---|
| 0072787 | 4/1984 | Japan . | |
| 0119729 | 6/1985 | Japan | 156/649 |
| 0136281 | 7/1985 | Japan . | |

OTHER PUBLICATIONS

Adachi et al., "Chemical Etching of InGaAsP/InP D H Wafer", J. Electrochem. Soc., vol. 129, No. 5, May 1982, pp. 1053–1061.

Huo et al., "Controlled Undercutting of V-Groove Channels for InP . . . ", J. Electrochem. Soc., vol. 135, No. 5, May 1988, pp. 1231–1234.

Chu et al., "Defect Structure in III-IV Compound Semiconductors", J. Appl. Phys., vol. 59, No. 10, 15 May 1986, pp. 3441–3447.

*Primary Examiner*—Olik Chaudhuri
*Assistant Examiner*—William Bunch
*Attorney, Agent, or Firm*—Lester H. Birnbaum

[57] ABSTRACT

Proposed is a method of fabricating semiconductor devices involving vapor etching of channels and/or growth of layers in a substrate. The etch or growth rate is controlled by opening up additional regions in the mask which are separated from the opening used to define the active region. The etching or growth in the additional exposed regions of the substrate consumes a certain amount of reactant and controllably reduces the amount available for etching or growth in the active region.

11 Claims, 3 Drawing Sheets

VAPOR PROCESSING OF A SUBSTRATE

BACKGROUND OF THE INVENTION

This invention relates to the fabrication of semiconductor devices.

The fabrication of certain semiconductor devices includes the step of etching channels in a semiconductor substrate. Notable among these devices are laser devices such as channel substrate buried heterostructure (CSBH) lasers. (See, for example, U.S. Pat. No. 4,660,208 issued to Johnston, Jr. et al.) A well-formed channel can be critical to good device performance. In most techniques presently employed, the channel is formed by use of an appropriate etch mask with an opening formed above the area of the substrate which will comprise the channel region. The exposed substrate is then typically etched by a chemical etchant, for example, a mixture of HCl and $H_3PO_4$ when the substrate is InP. (See, for example, U.S. Pat. No. 4,595,454 issued to Dautremont-Smith, et al.)

Present techniques appear to be adequate. However, vapor etching is an attractive alternative since it is inherently cleaner than chemical etching. It also has the potential for lower cost and higher throughput in cases where it is desired subsequently to form various device layers by vapor growth, since etching and growth can be done in a single chamber. One major problem which exists in masked vapor etching, however, is the fact that the gas etchant tends to move along the mask surface and attack the exposed substrate in the channel openings. This increases the etch rate, thereby making control of the etching difficult. Attempts to solve this problem by reducing the amount of etchant have not been satisfactory, in general, since reducing the concentration below a certain value tends to produce rough channel sidewalls.

The same problem has also been found where it is desired to effect vapor growth in the exposed area of a masked substrate. That is, growth rate will be difficult to control since the reactants will tend to move along the mask surface.

It is, therefore, an object of the invention to control vapor etching of channels and/or vapor growth of material in a semiconductor substrate.

SUMMARY OF THE INVENTION

This and other objects are achieved in accordance with the invention which is a method of fabricating a device including the steps of forming a mask layer on a major surface of a semiconductor substrate and forming a first opening in the mask layer over an area of the substrate which will define an active portion of the device. Additional openings are also formed in the mask layer over an area of the substrate which will comprise an inactive portion of the device. The substrate is then exposed to a vapor to produce a reaction in the portion exposed by the first opening. The distance of the additional openings from the first opening are such as to control the amount of vapor reaction in the first opening.

BRIEF DESCRIPTION OF THE DRAWING

These and other features are delineated in detail in the following description. In the drawing.

DETAILED DESCRIPTION OF THE INVENTION

Figure 1:
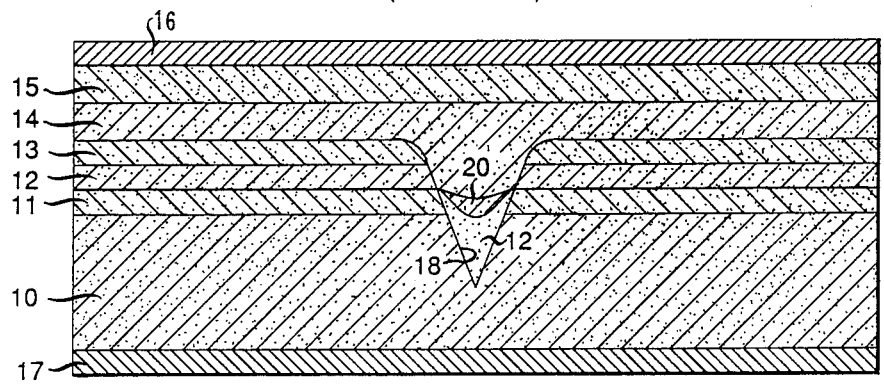
FIG. 1 is a cross-sectional view of a prior art laser device.

FIG. 1 illustrates a typical semiconductor laser device of a type which can be fabricated in accordance with the invention. The structure, which is known in the art as a channel substrate buried heterostructure (CSBH) laser, typically includes a substrate, 10, comprising n-type doped InP upon which is deposited, typically by metal organic chemical vapor deposition (MOCVD), an Fe-doped, high resistivity InP layer, 11. The layer, 11, is bifurcated by a groove, 18, which is etched therethrough and into the substrate, 10. An n-type InP cladding layer, 12, is grown, usually by liquid phase epitaxy, over the layer, 11, and in the groove, 18. An undoped layer, 13, comprising InGaAsP is formed, also by liquid phase epitaxy, over the layer, 12. A portion of layer, 13, forms crescent shape active region, 20, within the groove, 18, which region is separated from the remainder of layer, 13, since epitaxial growth does not take place along the top edges of the groove. The semiconductor structure is completed by forming, again by liquid phase epitaxy, a second cladding layer, 14, comprising p-type InP, and a contact layer, 15, comprising p-type InGaAs or InGaAsP. Electrical contact to the device is provided by metal layers, 16 and 17, deposited on layer, 15, and substrate, 10, respectively. (For a more detailed discussion of a CSBH laser, see U.S. Pat. No. 4,660,208, previously cited.)

Figure 2:
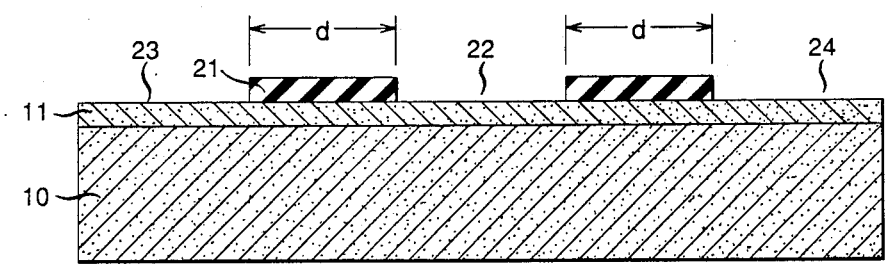
FIGS. 2 and 3 are cross-sectional and plan views, respectively, of a device during a stage of fabrication in accordance with an embodiment of the invention.
Figure 3:
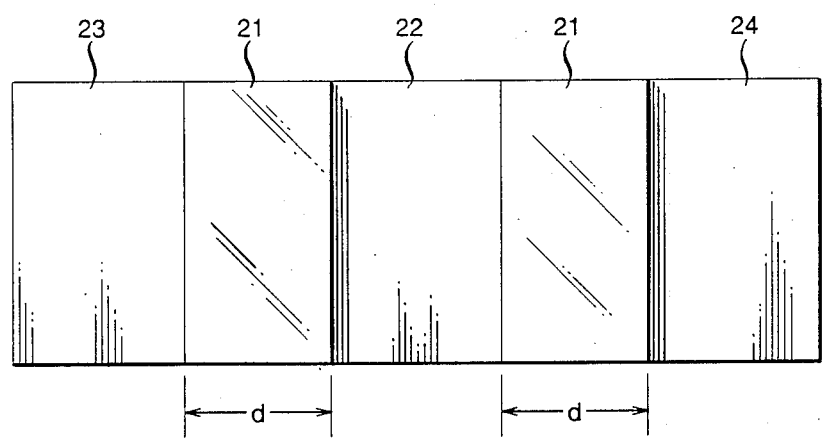

FIGS. 2 and 3 illustrate one step in forming a CSBH laser in accordance with the invention. After the layer, 11, is deposited on a major surface of the substrate, 10, a mask layer, 21, is formed over the same surface. The mask material is usually a layer of silicon dioxide with a thickness of approximately 2000 Å which is deposited uniformly over essentially the entire surface of the substrate. (It will be understood that, hereinafter, the term "substrate" is intended to include the layer, 11.) Openings are then formed in the mask layer by standard photolithographic techniques utilizing a photoresist layer (not shown) formed on the mask layer, 21, selectively illuminating the resist layer, developing the resist, etching the mask layer in selected areas and stripping the resist. The resulting structure is pictured in FIGS. 2 and 3. It will be noted that an opening, 22, is formed over the area of the substrate where the groove (18 of FIG. 4) will be etched. The opening runs the full length of the substrate, which is typically 19–50.8 μm as shown in FIG. 3 in accordance with standard practice. The groove, in turn, will define the extent of the active region of the device. The width of the groove is typically 2 microns and has been greatly exaggerated in the figures for purposes of illustration.

Ordinarily, the entire portion of the substrate outside the groove area, which will be the inactive portion of the device, would be covered by the mask layer. However, in accordance with a main feature of the invention, additional openings, 23 and 24, are formed in the mask at a predetermined distance, d, from the edges of the opening, 22, which will define the groove. The function of these additional openings is to expose portions of the underlying semiconductor material in order to consume a sufficient amount of the vapor etchant in the next step so that excess etchant will not reach the opening, 22, and adversely affect the etching of the groove. Controlled etching of the groove, therefore, is achieved by an appropriate choice of the distance d of the additional openings from the groove opening as discussed in more detail below.

Figure 4:
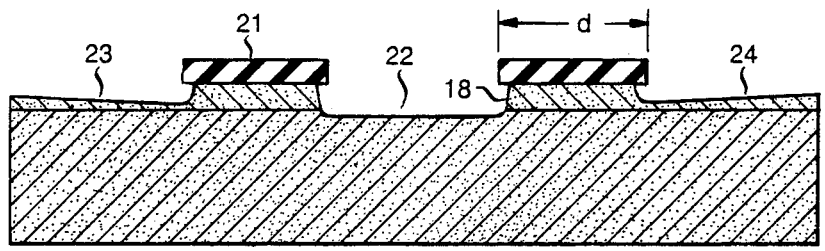
FIG. 4 is a cross-sectional view of the device during a later stage of fabrication.

The substrate is then subjected to a vapor etch to produce the structure illustrated in FIG. 4. The etchant employed was a standard mixture of HCl and $PH_3$ in hydrogen incident on the substrate for a period of approximately 1 minute at a temperature of 700 degrees C. The mole fractions of the two components were $3.6 \times 10^{-4}$ and $4.8 \times 10^{-4}$, respectively, in a total flow of 2100 sccm. Of course, the invention would be applicable to other vapor etchants and flow rates. The etching produced a channel, 18, in the area of the substrate exposed by opening, 22. The channel had sidewalls in the (111B) plane and a flat bottom surface in the (001) plane. However, other orientations could be used. For example, if the stripes are oriented perpendicular to that shown, grooves with sidewalls in the (111A) plane will be formed with no flat bottom. Etching parameters were chosen so that the channel, 18, extended all the way through layer, 11, and slightly into substrate, 10, i.e., a depth of approximately 2 microns. The portions of the substrate exposed by openings, 23 and 24, were also etched, but substantially less than the channel opening due to the flow of etchant. That is, each opening, 23 and 24, received a contribution of etchant flow from the surface of the mask, 21, on only one side, whereas the channel opening received a contribution from two sides. The contribution from the surface of the mask is also evident from the deeper etched portions near the edge of the mask openings in the openings, 23 and 24.

Figure 5:
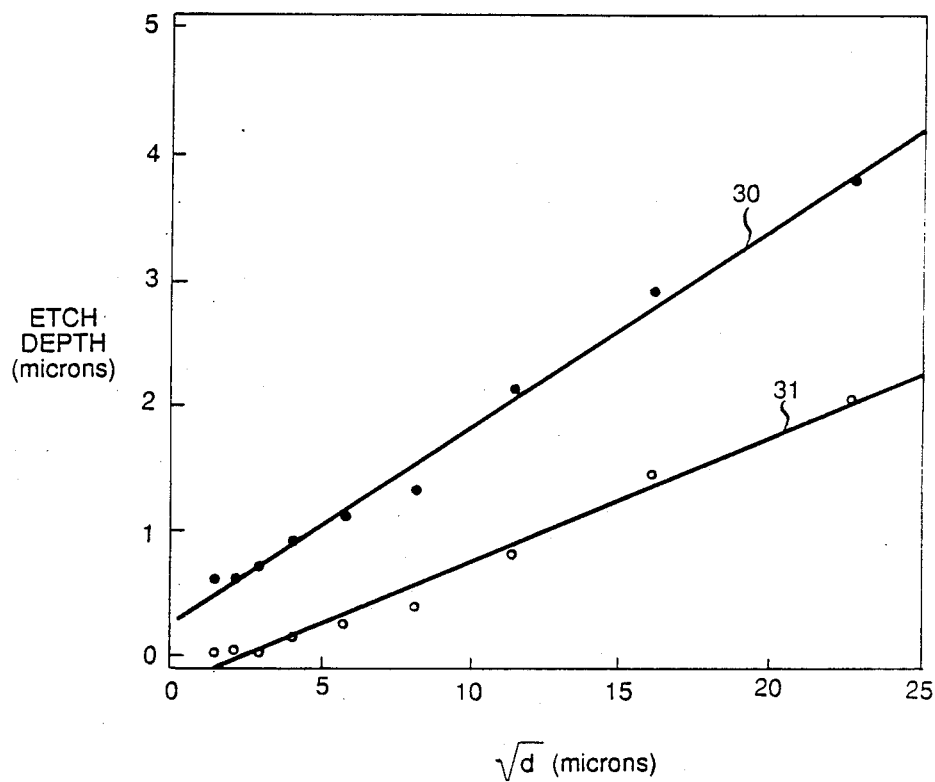
FIG. 5 is a graph of etch rates as a function of mask dimensions in accordance with the same embodiment.

It was discovered that the channel etch rate and the etch rate in the openings, 23 and 24, have a square root dependence on the width d of the etch mask. This relationship is illustrated in the graph of FIG. 5, with curve 30 showing the channel depth and curve 31 showing the maximum depth of etch in the field region near the mask edge. Thus, d is chosen to give a desired ratio of etching depths in the openings. In this particular example, the width, d, of the mask portions was approximately 100 microns which resulted in an etching ratio of approximately 2:1 in the opening, 22, and openings, 23 and 24. It has been found that mask width d should be greater than 30 microns. Widths below this tended to produce rough channel sidewalls and bottoms, indicating insufficient flow of etchant into the channel opening. Mask width d should also be less than 500 microns since widths above this give high, difficult to control etch rates. In general, the width of the openings should be at least as great as the width d. In the example, the width of the openings was 300 $\mu$m.

Figure 6:
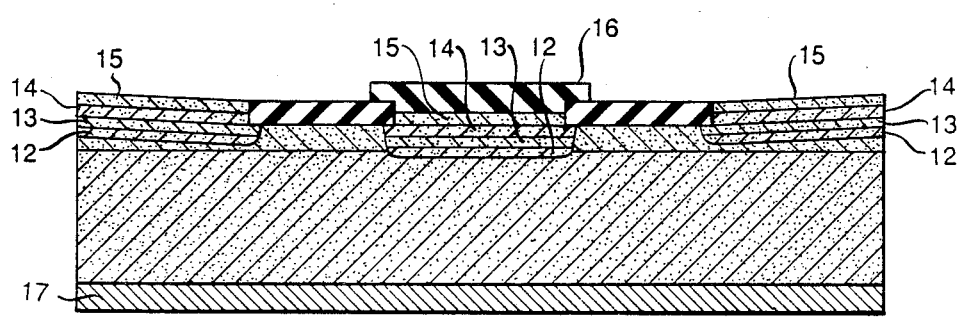
FIG. 6 is a cross-sectional view of the device in a final state of fabrication in accordance with the same embodiment.

One of the advantages of employing a vapor etch to form the channel is that the remaining layers can then all be formed in-situ by standard vapor phase epitaxial techniques. Thus, as illustrated in FIG. 6, an n-type InP cladding layer, 12, is first grown on the exposed portions of the substrate. This is followed by growth of the active layer, 13, which is an undoped InGaAsP layer. A second cladding layer, 14, comprising p-type InP is grown on the active layer, and a contact layer, 15, comprising p-type InGaAs or InGaAsP is grown on the second cladding layer. The structure is completed by selectively depositing a metal contact, 16, over the channel area and depositing a metal layer, 17, on essentially the entire opposite surface of the substrate, 12.

It will be appreciated that, although the active layer, 13, is formed over a substantial portion of the substrate, the active portion of the device is, nevertheless, confined to the channel region since current will flow only through the layers situated in the channel. This is due to the fact that the metal layer, 16, is essentially confined to the channel region and, also, the semi-insulating InP layer, 11, resides under the various active layers in the areas outside the channel.

It will be appreciated that, although the invention has been described with reference to the fabrication of CSBH lasers, the invention is not so limited. Rather, the inventive techniques can be employed in the fabrication of any semiconductor device which requires selective vapor reaction of a substrate to define an active region of the device. For example, the invention may be used in fabricating double channel planar buried heterostructure (DCPBH) lasers. (See U.S. Pat. No. 4,660,208.) The selective portion need not be a stripe, as in the described embodiment, but can be any desired shape as defined by an opening in the mask. Similarly, the additional openings formed outside the active region can be any desired shape.

It will also be realized that, although a single device is shown, typically many devices will be formed in a single substrate. In such cases, the width of the additional openings, 23 and 24, should be sufficient to ensure that there will be no interference in the etching of adjacent devices. In such cases, it is recommended that the width of openings, 23 and 24, be at least 100 $\mu$m and preferably 300 $\mu$m for usual laser fabrication.

Various additional modifications will become apparent to those skilled in the art. All such variations which basically rely on the teachings through which the invention has advanced the art are properly considered within the scope of the invention.

I claim:

1. A method of fabricating a device comprising the steps of:
    forming a mask layer over a major surface of a semiconductor substrate;
    forming a first opening in the mask layer over an area of the substrate which will define an active portion of the device;
    forming additional openings in the mask layer over an area of the substrate which will comprise an inactive portion of the device; and
    exposing the substrate to a vapor to produce a reaction in the portion exposed by the first opening, the distance of the additional openings from said first opening being such as to control the amount of vapor reaction in said first opening.

2. The method according to claim 1 wherein the reaction is an etching of the substrate to produce a channel.

3. The method according to claim 1 wherein the openings are in the shape of stripes running along the length of the substrate.

4. The method according to claim 2 further comprising the step of, subsequent to said etching, growing layers by vapor phase epitaxy over the areas of the substrate exposed by said openings in the mask.

5. The method according to claim 4 wherein one of said layers is capable of light emission upon application of an electrical bias to the active portion of the device.

6. The method according to claim 2 wherein the etching is done with an etchant comprising HCl and PH$_3$.

7. The method according to claim 2 wherein the depth of the channel is a linear function of the square root of the distance of the additional openings from the first opening.

8. The method according to claim 7 wherein the portions exposed by the additional openings are also etched to a depth which is a linear function of the square root of the distance of the additional openings from the first opening.

9. The method according to claim 8 wherein the distance of the additional openings from the first opening is such as to produce a ratio of etching depths thereunder of 2:1.

10. The method according to claim 1 wherein the substrate comprises InP, and the device is a channel substrate buried heterostructure laser.

11. A method of forming a semiconductor laser device comprising the steps of:

forming a mask layer over a major surface of a semiconductor substrate;

forming a first opening in the mask layer in the form of a stripe running the length of the substrate over an area of the substrate in which a channel will be formed to define a light emitting portion of the device;

forming additional openings in the mask layer in the form of stripes essentially parallel to the first opening over an area of the substrate which will comprise an inactive portion of the device;

vapor etching the substrate so as to form a first channel in the portion exposed by the first opening and additional channels in the portions exposed by the additional openings, the depth of the additional channels being less than that of the first channel, and the ratio of the depths of the channels being determined by the distance of the additional openings from the first opening; and growing layers by vapor phase epitaxy over the areas exposed by the openings in the mask, at least one of said layers being capable of light emission upon application of an electrical bias to the active portion of the device.

* * * * *